(12) United States Patent
Ito et al.

(10) Patent No.: US 10,861,720 B2
(45) Date of Patent: Dec. 8, 2020

(54) HEAT TREATMENT APPARATUS OF LIGHT IRRADIATION TYPE

(71) Applicant: SCREEN HOLDINGS CO., LTD., Kyoto (JP)

(72) Inventors: Yoshio Ito, Kyoto (JP); Takashi Kawamura, Kyoto (JP); Norimasa Matsui, Kyoto (JP)

(73) Assignee: SCREEN HOLDINGS CO., LTD., Kyoto (JP)

( * ) Notice: Subject to any disclaimer, the term of this patent is extended or adjusted under 35 U.S.C. 154(b) by 254 days.

(21) Appl. No.: 15/907,262

(22) Filed: Feb. 27, 2018

(65) Prior Publication Data

US 2018/0261479 A1  Sep. 13, 2018

(30) Foreign Application Priority Data

Mar. 8, 2017  (JP) .................................. 2017-043994

(51) Int. Cl.
  *H01L 21/67*  (2006.01)
  *H01L 21/683*  (2006.01)
  (Continued)

(52) U.S. Cl.
  CPC .... *H01L 21/67115* (2013.01); *H01L 21/2253* (2013.01); *H01L 21/2686* (2013.01);
  (Continued)

(58) Field of Classification Search
  None
  See application file for complete search history.

(56) References Cited

U.S. PATENT DOCUMENTS 5,018,054 A * 5/1991 Ohashi ...................... F21V 9/00
                                                                313/112
5,446,825 A * 8/1995 Moslehi ................ C23C 16/481
                                                                118/724
(Continued)

FOREIGN PATENT DOCUMENTS

JP    2001-023914 A    1/2001
JP    2002-222768 A    8/2002
(Continued)

OTHER PUBLICATIONS

Korean Notification of Reason for Refusal issued in corresponding Korean Patent Application No. 10-2018-0009320, dated Jul. 5, 2019, with English translation of the Japanese Translation of the Korean Office Action.
(Continued)

*Primary Examiner* — Joseph M. Pelham
(74) *Attorney, Agent, or Firm* — McDermott Will & Emery LLP

(57) ABSTRACT

A continuous lighting lamp irradiates a semiconductor wafer held by a quartz susceptor with light from below to perform preliminary heating, and then irradiation of a flash of light is performed by a flash lamp from above. A light absorption ring is provided so as to be close to a peripheral portion of the semiconductor wafer held by the susceptor. The light absorption ring absorbs infrared light and transmits visible light through itself. During preliminary heating, the light absorption ring absorbs light emitted from the continuous lighting lamp to be increased in temperature so that heat radiated from the peripheral portion of the wafer is compensated to cause in-plane temperature distribution of the semiconductor wafer to be uniform. Meanwhile, the flash of light is transmitted through the light absorption ring, so that
(Continued)

the light absorption ring is prevented from being damaged by the irradiation of the flash of light.

4 Claims, 9 Drawing Sheets

(51) Int. Cl.
- *F27B 5/14* (2006.01)
- *H01L 21/687* (2006.01)
- *H05B 3/00* (2006.01)
- *H01L 21/225* (2006.01)
- *H01L 21/268* (2006.01)

(52) U.S. Cl.
CPC .... *H01L 21/67248* (2013.01); *H01L 21/6875* (2013.01); *H01L 21/68707* (2013.01); *H01L 21/68735* (2013.01); *H01L 21/68742* (2013.01); *H01L 21/68757* (2013.01); *H05B 3/0047* (2013.01); *F27B 5/14* (2013.01)

(56) References Cited

U.S. PATENT DOCUMENTS

| | | | |
|---|---|---|---|
| 5,715,361 A * | 2/1998 | Moslehi | C23C 16/482 |
| | | | 118/725 |
| 5,861,609 A * | 1/1999 | Kaltenbrunner | H01L 21/2686 |
| | | | 118/50.1 |
| 7,041,610 B1 | 5/2006 | Tillmann et al. | |
| 8,901,460 B2 * | 12/2014 | Hashimoto | H01L 21/67115 |
| | | | 219/411 |
| 9,082,728 B2 * | 7/2015 | Yokouchi | H01L 21/324 |
| 9,351,341 B2 * | 5/2016 | Nishide | H05B 1/00 |
| 9,607,868 B2 * | 3/2017 | Okada | H01L 21/67103 |
| 9,607,870 B2 * | 3/2017 | Kiyama | H01L 21/67115 |
| 9,920,993 B2 * | 3/2018 | Hashimoto | F27B 17/0025 |
| 10,475,674 B2 * | 11/2019 | Nishide | H01L 21/67115 |
| 2002/0005400 A1 | 1/2002 | Gat | |
| 2003/0146200 A1 * | 8/2003 | Takahashi | C30B 31/12 |
| | | | 219/390 |
| 2014/0161429 A1 | 6/2014 | Yokouchi et al. | |
| 2014/0169772 A1 * | 6/2014 | Abe | H01L 21/6875 |
| | | | 392/418 |
| 2014/0206108 A1 * | 7/2014 | Kiyama | H01L 21/67115 |
| | | | 438/5 |
| 2014/0261554 A1 | 9/2014 | Hayashi et al. | |
| 2017/0355637 A1 * | 12/2017 | Nomura | C03C 3/093 |

FOREIGN PATENT DOCUMENTS

| | | |
|---|---|---|
| JP | 2003-513442 A | 4/2003 |
| JP | 2007-227461 A | 9/2007 |
| JP | 2010-225645 A | 10/2010 |
| JP | 2011-145442 A | 7/2011 |
| JP | 2013-069962 A | 4/2013 |
| JP | 2013-206896 A | 10/2013 |
| JP | 2014-011256 A | 1/2014 |
| JP | 2014-175637 A | 9/2014 |
| KR | 10-1998-0016834 A | 6/1998 |
| KR | 10-2014-0001742 A | 1/2014 |
| KR | 10-2014-0076501 A | 6/2014 |

OTHER PUBLICATIONS

Taiwanese Office Action issued in corresponding Taiwanese Patent Application No. 106142372, dated Jul. 24, 2018, with English Translation of the Japanese Translation of the Taiwanese Office Action.

Japanese Decision to Grant a Patent issued in corresponding Japanese Patent Application No. 2017-043994, dated Sep. 23, 2020, with English translation.

* cited by examiner

F I G. 2
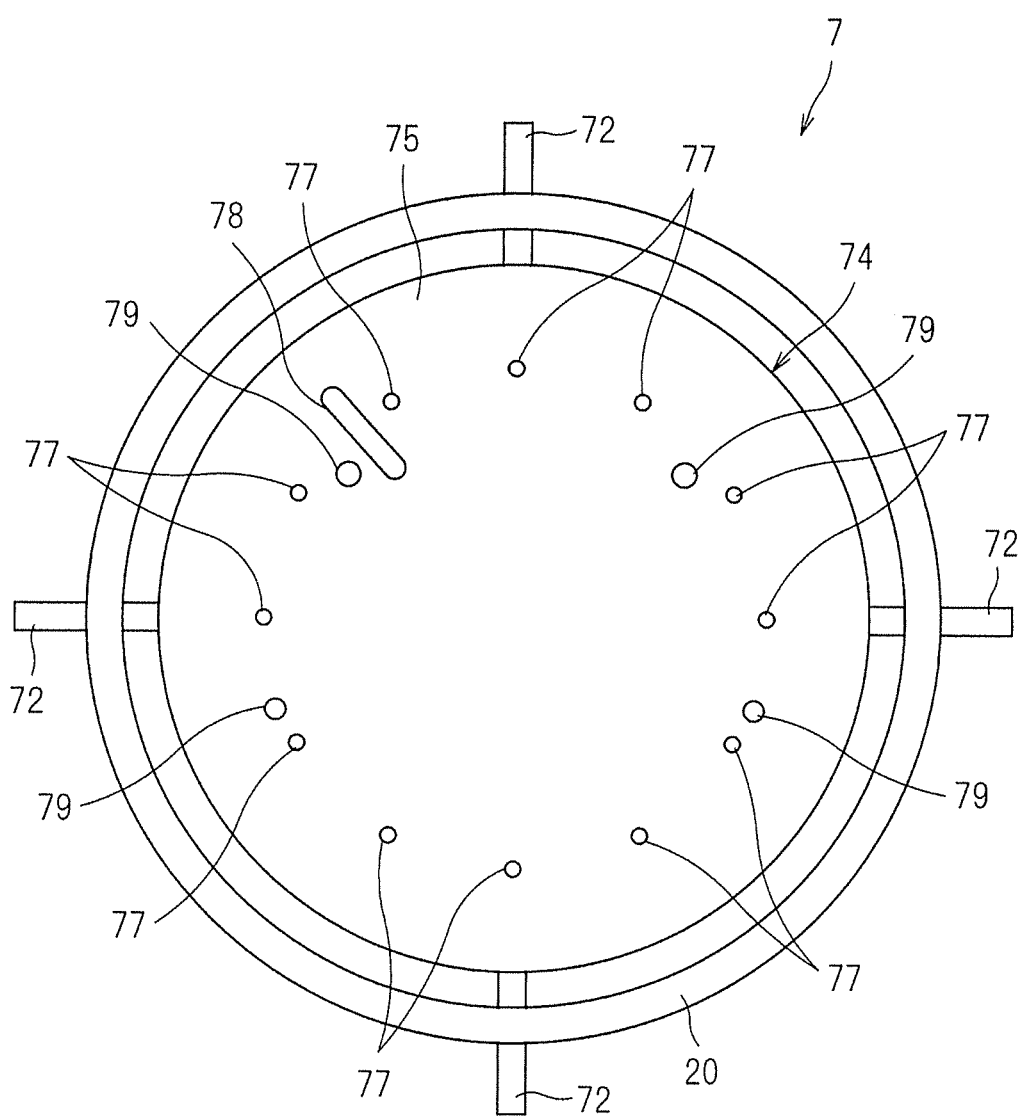

F I G. 3
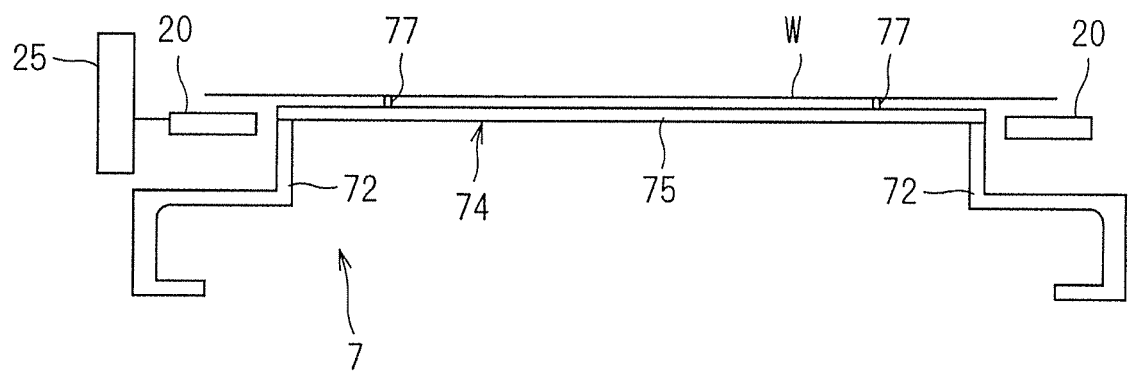

F I G. 7
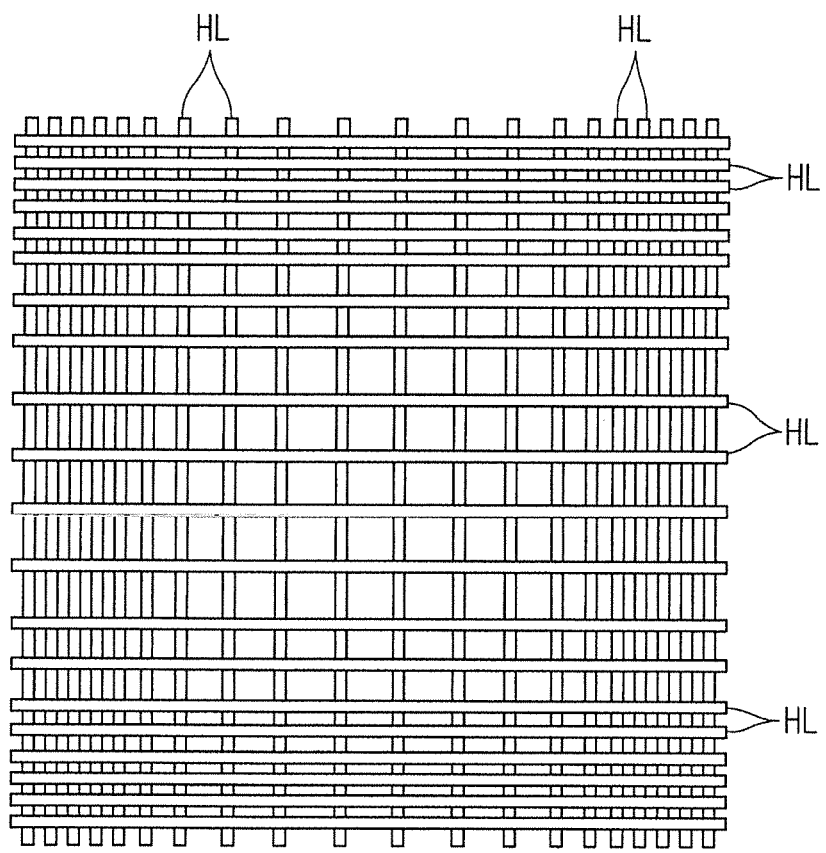

F I G . 8
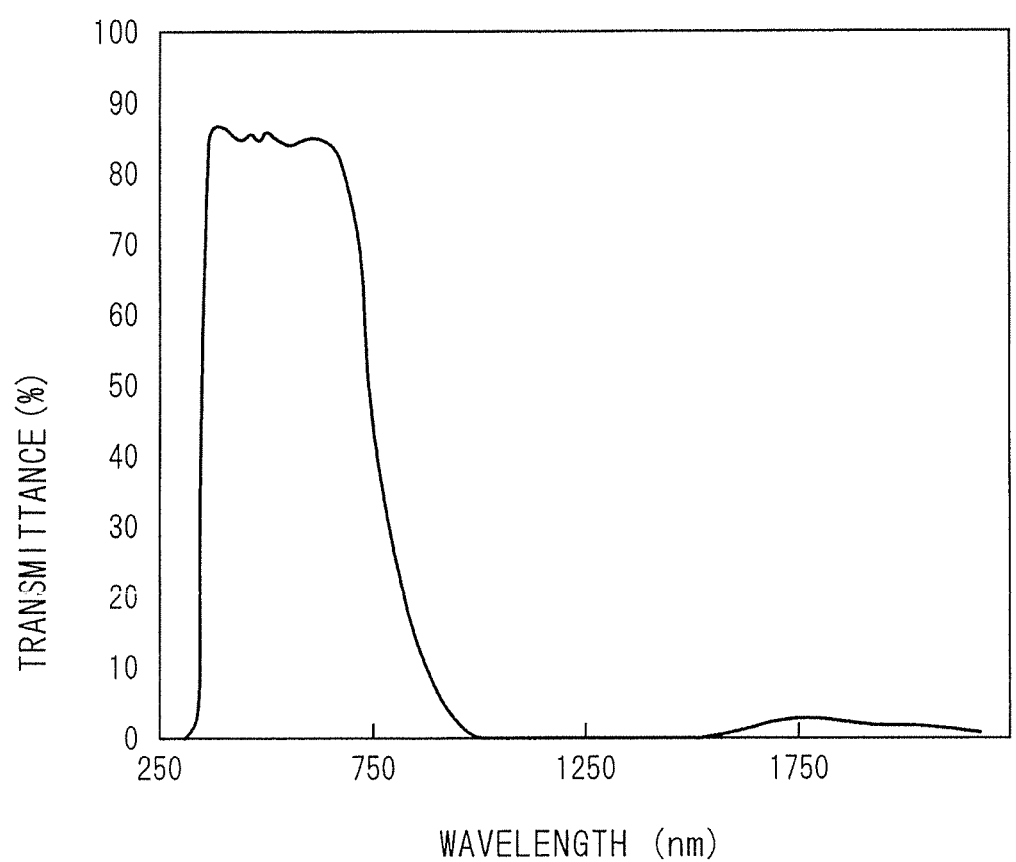

F I G. 9
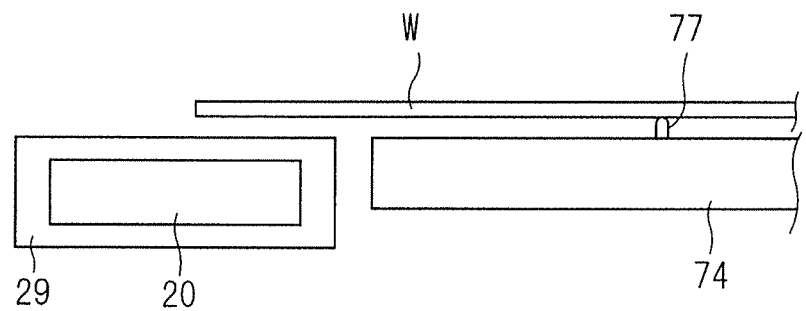

HEAT TREATMENT APPARATUS OF LIGHT IRRADIATION TYPE

BACKGROUND OF THE INVENTION

Field of the Invention

The present invention relates to a heat treatment apparatus for irradiating a thin-plated precision electronic substrate (hereinafter referred to as simply "substrate") such as a semiconductor wafer with a flash of light to heat the substrate.

Description of the Background Art

In a manufacturing process of semiconductor devices, impurity implant is an essential process to form a p-n junction in a semiconductor wafer. At present, impurity implant is typically performed by an ion implantation method followed by an annealing method. The ion implantation method is a technique for physically performing impurity implantation by ionizing elements of impurities, such as boron (B), arsenic (As), and phosphorus (P), and colliding them with a semiconductor wafer by using highly accelerated voltage. The impurities implanted are activated by annealing treatment. At the time, when annealing time is about a few seconds or more, implanted impurities are deeply diffused by heat. As a result, junction depth becomes too deeper than required depth, and this may hinder forming of a favorable device.

In recent years, flash lamp annealing (FLA) has been paid attention as an annealing technique for heating a semiconductor wafer for an extremely short time. The flash lamp annealing is a heat treatment technique for irradiating a surface of a semiconductor wafer with a flash of light by using a xenon flash lamp (hereinafter when referred to as simply a "flash lamp", it means a xenon flash lamp) to increase temperature of only the surface of a semiconductor wafer into which impurities are implanted in an extremely short time (milliseconds or less).

The xenon flash lamp has an emission spectroscopy distribution radiation from an ultraviolet part to a near-infrared part, and has a wave length that is shorter than that of a conventional halogen lamp, and that almost coincides with that of a fundamental absorption band of a semiconductor wafer made of silicon. This causes transmitted light to decrease when the xenon flash lamp irradiates a semiconductor wafer with a flash of light, so that temperature of the semiconductor wafer can be rapidly increased. It is also found that flash irradiation for an extremely short time of milliseconds or less enables only near a surface of a semiconductor wafer to be selectively increased in temperature. Thus, when temperature rises for an extremely short time by a xenon flash lamp, only impurity activation can be performed without diffusing impurities deeply.

As a heat treatment apparatus using a xenon flash lamp as described above, Japanese Patent Application Laid-Open No. 2010-225645 discloses a heat treatment apparatus in which a flash lamp is disposed on a front surface side of a semiconductor wafer, and a halogen lamp is disposed on a back surface side thereof, to perform desired heat treatment by combination of the lamps, for example. In the heat treatment apparatus disclosed in Japanese Patent Application Laid-Open No. 2010-225645, the halogen lamp preheats a semiconductor wafer to some extent temperature, and then a front surface of the semiconductor wafer is increased in temperature to a desired treatment temperature by irradiation of flashes of light from the flash lamp.

In the heat treatment apparatus disclosed in Japanese Patent Application Laid-Open No. 2010-225645, heat treatment is performed by mounting a circular semiconductor wafer on a plurality of minute support pins provided on a circular quartz plate. The circular plate has a diameter larger than that of the semiconductor wafer. When a halogen lamp preheats a semiconductor wafer mounted on a quartz plate as described above, heat is remarkably dissipated from an outer peripheral portion of the semiconductor wafer. This is liable to cause a problem in that temperature decrease in the outer peripheral portion is increased to cause in-plane temperature distribution of the semiconductor wafer to be non-uniform.

Thus, Japanese Patent Application Laid-Open No. 2010-225645 provides a technique in which a temperature compensation ring made of silicon carbide (SiC) is provided in a peripheral portion of a circular plate, and the temperature compensation ring is increased in temperature at the time of preliminary heating by a halogen lamp to compensate heat dissipated from an outer peripheral portion of a semiconductor wafer with the increase in temperature. This enables in-plane temperature distribution of a semiconductor wafer in a preliminary heating stage to be uniform.

Unfortunately, a temperature compensation ring made of silicon carbide causes an additional problem in that it is thermally damaged at the time of flash heating with a flash of light emitted from a flash lamp, following preliminary heating.

SUMMARY OF THE INVENTION

The present invention intends for a heat treatment apparatus for irradiating a substrate with a flash of light to heat the substrate.

In an aspect of the present invention, a heat treatment apparatus includes the following: a chamber that accommodates a substrate; a quartz susceptor that holds the substrate in the chamber; a continuous lighting lamp that is provided under the chamber to irradiate a lower surface of the substrate held by the susceptor with light; a flash lamp that is provided over the chamber to irradiate an upper surface of the substrate held by the susceptor with a flash of light; and an infrared-light absorption component that is provided so as to be close to a peripheral portion of the substrate held by the susceptor to absorb infrared light and transmit visible light through itself.

In another aspect of the present invention, a heat treatment apparatus includes the following: a chamber that accommodates a substrate; a quartz susceptor that holds the substrate in the chamber; a continuous lighting lamp that is provided under the chamber to irradiate a lower surface of the substrate held by the susceptor with light; a flash lamp that is provided over the chamber to irradiate an upper surface of the substrate held by the susceptor with a flash of light; and an infrared-light absorption component that is provided so as to be close to a peripheral portion of the substrate held by the susceptor, and has an infrared light transmittance of 20% or less, and a visible light transmittance of 60% or more.

The infrared-light absorption component absorbs light from the continuous lighting lamp to compensate heat dissipated from a peripheral portion of a substrate, and a flash of light is transmitted through the infrared-light absorption component. As a result, in-plane temperature distribution of the substrate can be uniform without causing damage by irradiation of a flash of light.

It is preferable that the heat treatment apparatus further include a drive assembly that moves up and down the infrared-light absorption component in the chamber.

It is possible to adjust a heating level of a peripheral portion of a substrate by the infrared-light absorption component.

It is preferable that the infrared-light absorption component be covered with a quartz covering member.

Even when an unfavorable component is contained in the infrared-light absorption component, it is possible to prevent such a component from adhering to a substrate.

It is preferable that the susceptor have a plane size smaller than that of the substrate.

Heat dissipation from a peripheral portion of a substrate can be reduced to enable in-plane temperature distribution of the substrate to be more uniform.

Thus, it is an object of the present invention to cause in-plane temperature distribution of the substrate to be uniform without causing damage by irradiation of a flash of light.

These and other objects, features, aspects and advantages of the present invention will become more apparent from the following detailed description of the present invention when taken in conjunction with the accompanying drawings.

BRIEF DESCRIPTION OF THE DRAWING

FIG. 2 is a plan view of a holder;

FIG. 3 is a longitudinal sectional view of the holder;

FIG. 7 is a plan view illustrating a placement of halogen lamps;

FIG. 8 is a graph showing spectral characteristics of transmittance of a light absorption ring; and FIG. 9 illustrates an example of a light absorption ring covered with quartz.

DESCRIPTION OF THE PREFERRED EMBODIMENTS

Hereinafter, embodiments of the present invention will be described in detail with reference to drawings.

Figure 1:
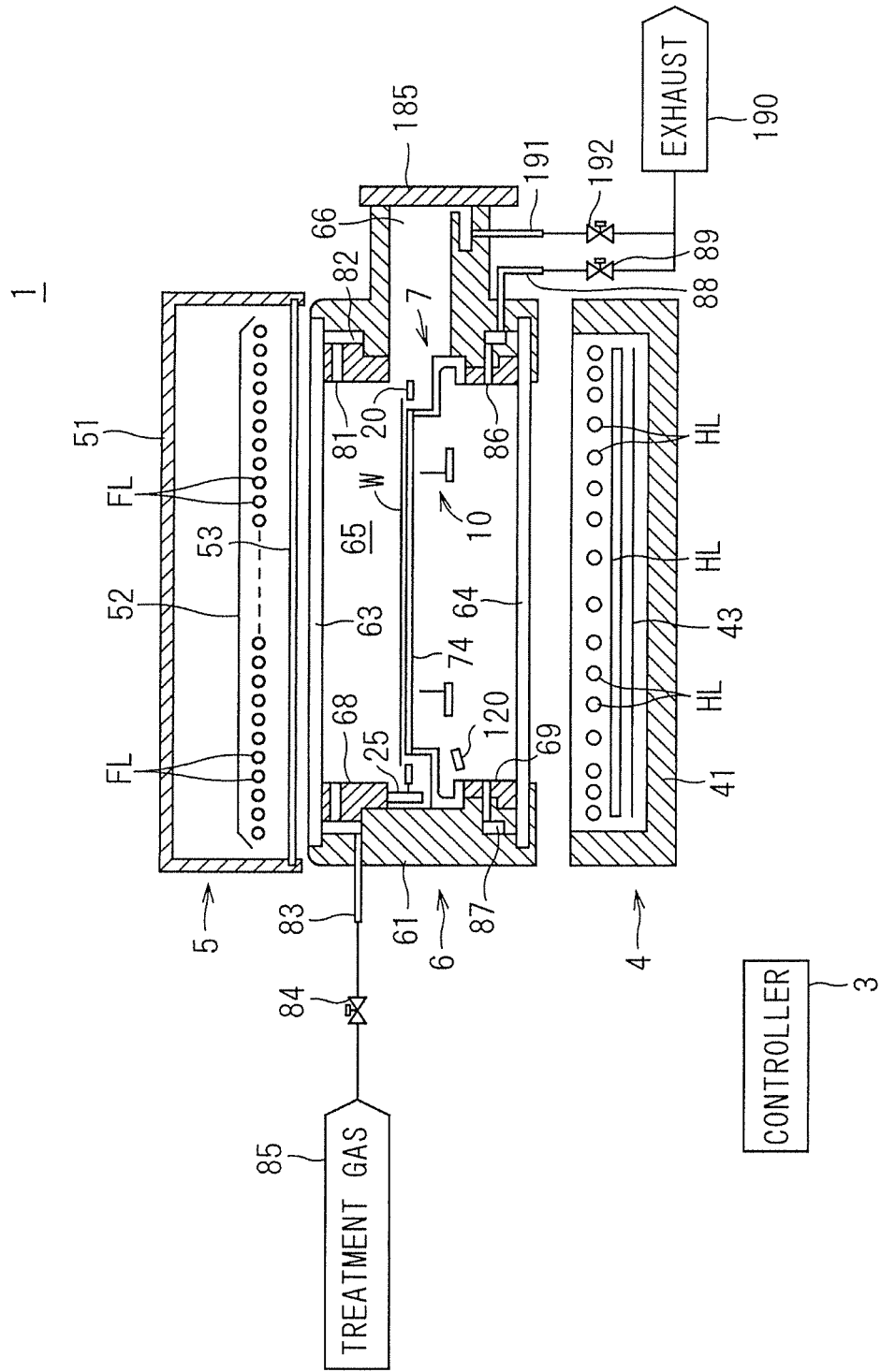
FIG. 1 is a longitudinal sectional view illustrating a structure of a heat treatment apparatus according to the present invention.

FIG. 1 is a longitudinal sectional view illustrating structure of a heat treatment apparatus 1 according to the present invention. The heat treatment apparatus 1 of the present preferred embodiment is a flash lamp annealer that irradiates a semiconductor wafer W in the shape of a disk, as a substrate, with a flash of light to heat the semiconductor wafer W. While a size of the semiconductor wafer W to be treated is not particularly limited, the semiconductor wafer W to be treated has a diameter of 300 mm or 450 mm, for example. In FIG. 1 and the subsequent drawings, dimensions of components and the number of components are illustrated while being exaggerated or simplified, as appropriate, for easy understanding.

The heat treatment apparatus 1 includes a chamber 6 that accommodates a semiconductor wafer W, a flash heating unit 5 having a plurality of built-in flash lamps FL, and a halogen heating unit 4 having a plurality of built-in halogen lamps HL. The flash heating unit 5 is provided over the chamber 6, and the halogen heating unit 4 is provided under the chamber 6. The heat treatment apparatus 1 further includes a holder 7 provided inside the chamber 6 and for holding a semiconductor wafer W in a horizontal posture, and a transfer mechanism 10 provided inside the chamber 6 and for transferring a semiconductor wafer W between the holder 7 and the outside of the heat treatment apparatus 1. The heat treatment apparatus 1 further includes a controller 3 that controls an operating mechanism provided in each of the halogen heating unit 4, the flash heating unit 5, and the chamber 6 to apply heat treatment to a semiconductor wafer W.

The chamber 6 includes a tubular chamber side portion 61, and chamber windows made of quartz mounted on the top and bottom of the chamber side portion 61. The chamber side portion 61 has a substantially tubular shape with an open top and an open bottom. The upper chamber window 63 is mounted to block the open top of the chamber side portion 61, and the lower chamber window 64 is mounted to block the open bottom thereof. The upper chamber window 63 forming the ceiling of the chamber 6 is a disk-shaped member made of quartz, and serves as a quartz window that transmits flashes of light emitted from the flash heating unit 5 therethrough into the chamber 6. The lower chamber window 64 forming the floor of the chamber 6 is also a disk-shaped member made of quartz, and serves as a quartz window that transmits light emitted from the halogen heating unit 4 therethrough into the chamber 6.

An upper reflective ring 68 is mounted to an upper portion of the inner wall surface of the chamber side portion 61, and a lower reflective ring 69 is mounted to a lower portion thereof. Both of the upper and lower reflective rings 68 and 69 are in the form of an annular ring. The upper reflective ring 68 is mounted by being inserted downwardly from the top of the chamber side portion 61. The lower reflective ring 69, on the other hand, is mounted by being inserted upwardly from the bottom of the chamber side portion 61 and fastened with screws (not illustrated). In other words, the upper and lower reflective rings 68 and 69 are removably mounted to the chamber side portion 61. An interior space of the chamber 6, i.e. a space surrounded by the upper chamber window 63, the lower chamber window 64, the chamber side portion 61, and the upper and lower reflective rings 68 and 69, is defined as a heat treatment space 65. The chamber side portion 61 and the upper and lower reflective rings 68 and 69 are made of a metal material (e.g., stainless steel) with high strength and high heat resistance.

The chamber side portion 61 is provided with a transport opening (throat) 66 for the transfer of a semiconductor wafer W therethrough into and out of the chamber 6. The transport opening 66 is openable and closable by a gate valve 185. The transport opening 66 is connected in communication with the heat treatment space 65. Thus, when the transport opening 66 is opened by the gate valve 185, a semiconductor wafer W is allowed to be transferred through the transport opening 66 into and out of the heat treatment space 65. When the transport opening 66 is closed by the gate valve 185, the heat treatment space 65 in the chamber 6 is an enclosed space.

At least one gas supply opening 81 for supplying a treatment gas therethrough into the heat treatment space 65 is provided in an upper portion of the inner wall of the chamber 6. The gas supply opening 81 may be provided in the upper reflective ring 68. The gas supply opening 81 is connected in communication with a gas supply pipe 83 through a buffer space 82 provided in the form of an annular ring inside the side wall of the chamber 6. The gas supply pipe 83 is connected to a treatment gas supply source 85. A valve 84 is provided at some midpoint in the gas supply pipe 83. When the valve 84 is opened, the treatment gas is fed from the treatment gas supply source 85 to the buffer space 82. The treatment gas flowing into the buffer space 82 flows in a spreading manner within the buffer space 82 that is lower in fluid resistance than the gas supply opening 81, and is supplied through the gas supply opening 81 into the heat treatment space 65. Examples of the treatment gas usable herein include inert gases such as nitrogen gas ($N_2$), and reactive gases such as hydrogen ($H_2$) and ammonia ($NH_3$) (nitrogen gas is used in this preferred embodiment).

Meanwhile, at least one gas exhaust opening 86 for exhausting a gas from the heat treatment space 65 is provided in a lower portion of the inner wall of the chamber 6. The gas exhaust opening 86 may be provided in the lower reflective ring 69. The gas exhaust opening 86 is connected in communication with a gas exhaust pipe 88 through a buffer space 87 provided in the form of an annular ring inside the side wall of the chamber 6. The gas exhaust pipe 88 is connected to an exhaust unit 190. A valve 89 is provided at some midpoint in the gas exhaust pipe 88. When the valve 89 is opened, the gas in the heat treatment space 65 is discharged through the gas exhaust opening 86 and the buffer space 87 to the gas exhaust pipe 88. The at least one gas supply opening 81 and the at least one gas exhaust opening 86 may include a plurality of gas supply openings 81 and a plurality of gas exhaust openings 86, respectively, provided in a circumferential direction of the chamber 6, and each may be in the form of a slit. The treatment gas supply source 85 and an exhaust unit 190 each may be a mechanism provided in the heat treatment apparatus 1, or a utility system of a factory in which the heat treatment apparatus 1 is installed.

A gas exhaust pipe 191 for exhausting the gas from the heat treatment space 65 is also connected to a distal end of the transport opening 66. The gas exhaust pipe 191 is connected to the exhaust unit 190 through a valve 192. When the valve 192 is opened, the gas in the chamber 6 is exhausted through the transport opening 66.

FIG. 2 is a plan view of the holder 7. FIG. 3 is a longitudinal sectional view of the holder 7. The holder 7 includes a support part 72 and a susceptor 74. The support part 72 and the susceptor 74 are all made of quartz. In other words, the whole of the holder 7 is made of quartz.

The susceptor 74 is supported by four support parts 72 attached to an internal wall surface of the chamber 6. The susceptor 74 includes a holding plate 75 in the shape of a circular plate, and a plurality of substrate support pins 77 provided upright on an upper surface thereof. The holding plate 75 is a substantially circular planar member made of quartz. The holding plate 75 has a diameter smaller than that of the semiconductor wafer W. That is, the susceptor 74 has a plane size smaller than that of the semiconductor wafer W.

The substrate support pins 77 are provided upright on the upper surface of the holding plate 75. In the present preferred embodiment, a total of 12 substrate support pins 77 are provided upright at intervals of 30 degrees along the circumference of a circle concentric with the outer circumference of the holding plate 75 in the shape of a circular plate. The diameter of the circle on which the 12 substrate support pins 77 are disposed (the distance between opposed ones of the substrate support pins 77) is slightly smaller than the diameter of the semiconductor wafer W, and is 270 mm to 280 mm (in the present preferred embodiment, 270 mm) when the diameter of the semiconductor wafer W is 300 mm. Each of the substrate support pins 77 is made of quartz. The substrate support pins 77 may be provided by welding on the upper surface of the holding plate 75 or machined integrally with the holding plate 75.

A peripheral portion of the holding plate 75 of the susceptor 74 is supported by the four support parts 72. Specifically, a peripheral portion of a lower surface of the holding plate 75 is supported by an upper end of a portion vertically extending, formed at a distal end of each of the support parts 72. In a state where the susceptor 74 is supported by the four support parts 72, the holding plate 75 of the susceptor 74 has a horizontal posture (a posture in which the normal to the susceptor 74 coincides with a vertical direction). In other words, the upper surface of the holding plate 75 becomes a horizontal surface.

A semiconductor wafer W transferred into the chamber 6 is placed and held in a horizontal posture on the susceptor 74. At this time, the semiconductor wafer W is supported by the 12 substrate support pins 77 provided upright on the holding plate 75, and is held by the susceptor 74. More strictly speaking, the respective upper ends of the 12 substrate support pins 77 come in contact with the lower surface of the semiconductor wafer W to support the semiconductor wafer W. The semiconductor wafer W can be supported in a horizontal posture by the 12 substrate support pins 77 because the 12 substrate support pins 77 each have a uniform height (distance from the upper end of the substrate support pin 77 to the upper surface of the holding plate 75).

As illustrated in FIG. 2, an opening 78 is provided in the holding plate 75 of the susceptor 74 so as to extend vertically through the holding plate 75 of the susceptor 74. The opening 78 is provided for a radiation thermometer 120 (refer to FIG. 1) to receive radiation (infrared radiation) emitted from the lower surface of the semiconductor wafer W. Specifically, the radiation thermometer 120 receives the radiation emitted from the lower surface of the semiconductor wafer W through the opening 78, and a separately placed detector measures the temperature of the semiconductor wafer W. Further, the holding plate 75 of the susceptor 74 further includes four through holes 79 bored therein and designed so that lift pins 12 of the transfer mechanism 10 to be described later pass through the respective through holes 79 to transfer a semiconductor wafer W.

Figure 4:
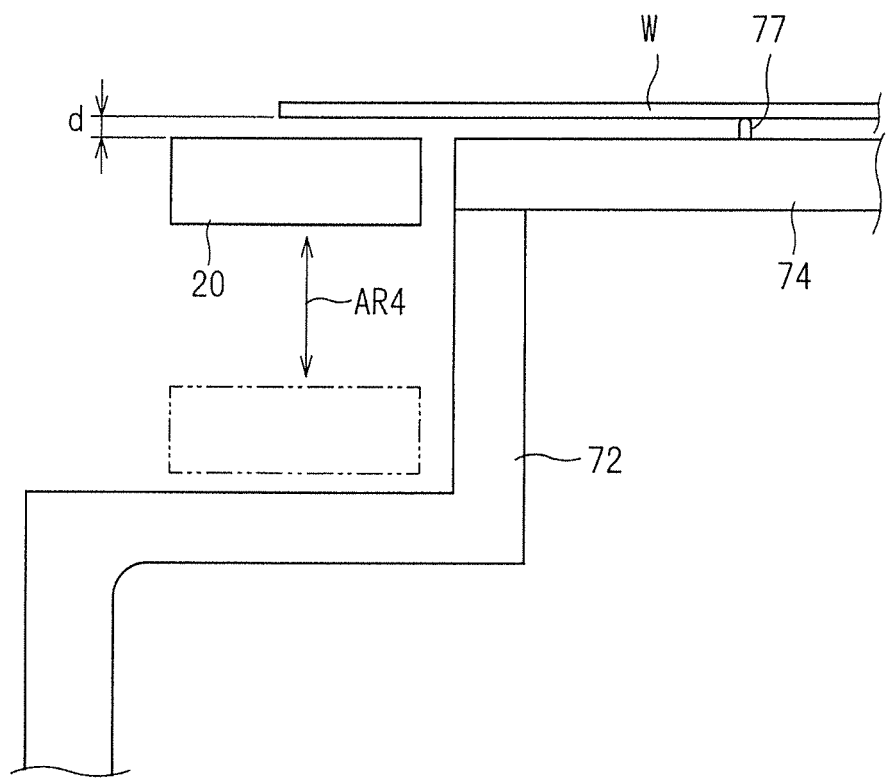
FIG. 4 is an enlarged view of the vicinity of a light absorption ring.

In addition, a light absorption ring 20 is disposed so as to surround the periphery of the susceptor 74 in the shape of a circular plate. FIG. 4 is an enlarged view of the vicinity of the light absorption ring 20. The light absorption ring 20 is a member in an annular shape. The light absorption ring 20 in an annular shape has a bore diameter that is larger than a diameter of the holding plate 75 of the susceptor 74, and is smaller than a diameter of the semiconductor wafer W. The light absorption ring 20 has an outer diameter larger than the diameter of the semiconductor wafer W. The light absorption ring 20 can have an appropriate thickness.

FIG. 8 is a graph showing spectral characteristics of transmittance of the light absorption ring 20. As shown in FIG. 8, the light absorption ring 20 has a visible light transmittance of 60% or more, and an infrared light transmittance of 20% or less. That is, the light absorption ring 20 is made of a material with a property of absorbing infrared light and transmitting visible light through itself. As a material with a property as described above, an infrared ray absorption filter ISK-150 made by Isuzu Glass Ltd. is available, for example.

The light absorption ring 20 has a bore diameter smaller than the diameter of the semiconductor wafer W, so that the light absorption ring 20 is provided so as to be close to a peripheral portion of a lower surface of the semiconductor wafer W held by the susceptor 74. As illustrated in FIGS. 1 and 3, the light absorption ring 20 is provided so as to be movable up and down by a lifting drive unit 25 attached to a wall surface of the chamber 6. The lifting drive unit 25 vertically moves the light absorption ring 20 below a peripheral portion of the semiconductor wafer W held by the susceptor 74 as indicated by arrow AR4 of FIG. 4 to adjust a distance d between the peripheral portion of the lower surface of the semiconductor wafer W and the light absorption ring 20.

Figure 5:
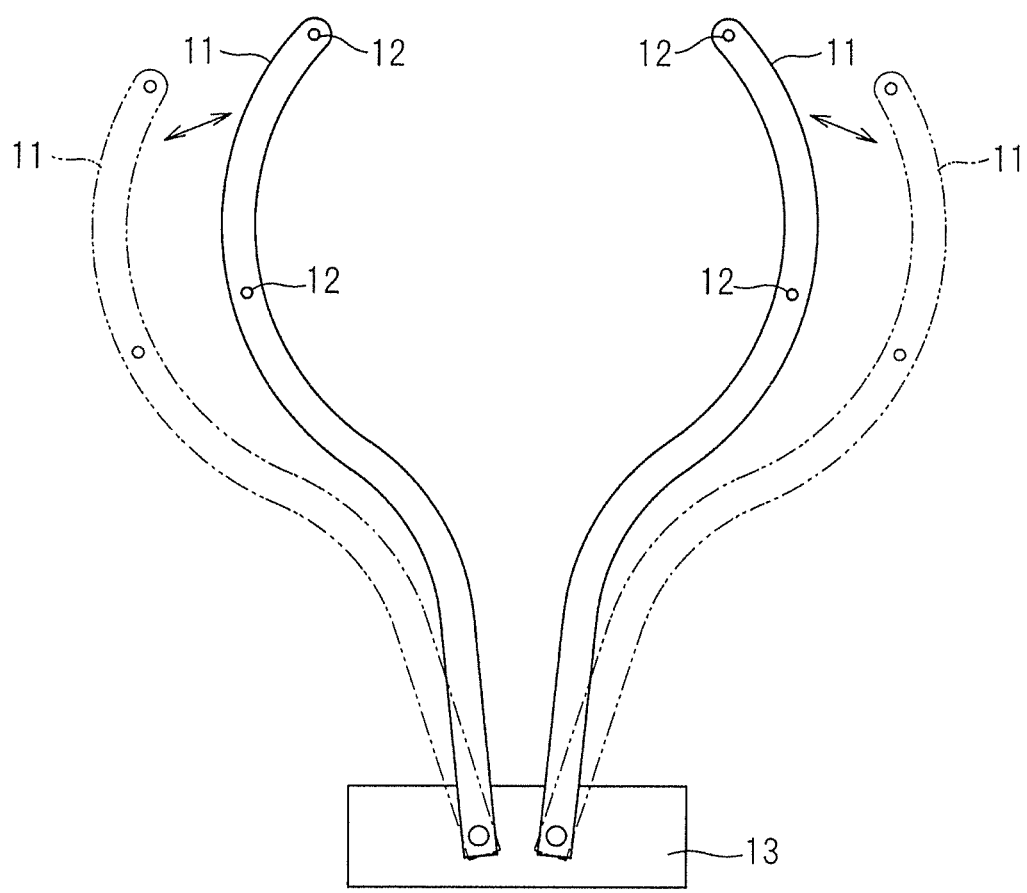
FIG. 5 is a plan view of a transfer mechanism.
Figure 6:
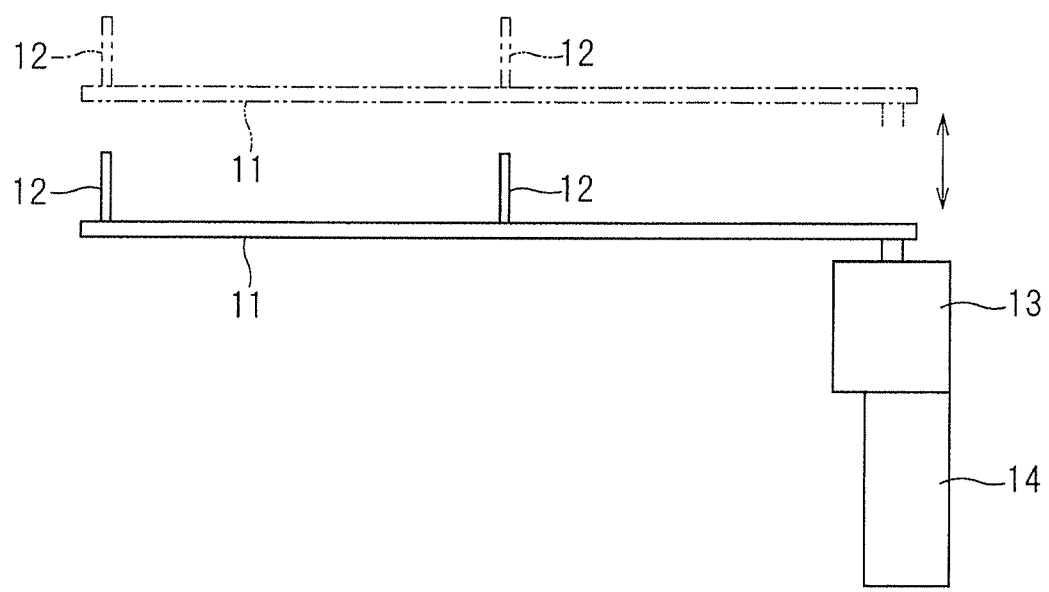
FIG. 6 is a side view of the transfer mechanism.

FIG. 5 is a plan view of the transfer mechanism 10. FIG. 6 is a side view of the transfer mechanism 10. The transfer mechanism 10 includes the two transfer arms 11. The transfer arms 11 each are in an arcuate shape such as along an inner wall of a chamber side portion 61 in a substantially cylindrical shape. Each of the transfer arms 11 includes the two lift pins 12 mounted upright thereon. The transfer arms 11 are pivotable by a horizontal movement mechanism 13. The horizontal movement mechanism 13 moves the pair of transfer arms 11 horizontally between a transfer operation position (a position indicated by solid lines in FIG. 5) in which a semiconductor wafer W is transferred to and from the holder 7 and a retracted position (a position indicated by dash-double-dot lines in FIG. 5) in which the transfer arms 11 do not overlap the semiconductor wafer W held by the holder 7 as seen in plan view. The horizontal movement mechanism 13 may be of the type that causes individual motors to pivot the respective transfer arms 11, or may be of the type which uses a linkage mechanism to cause a single motor to pivot the pair of transfer arms 11 in cooperative relation.

The pair of transfer arms 11 are moved up and down together with the horizontal movement mechanism 13 by a lifting mechanism 14. When the lifting mechanism 14 moves up the pair of transfer arms 11 at their transfer operation position, the four lift pins 12 in total pass through the respective four through holes 79 (refer to FIG. 2) bored in the susceptor 74 so that the upper ends of the lift pins 12 protrude from the upper surface of the susceptor 74. Meanwhile, when the lifting mechanism 14 moves down the pair of transfer arms 11 at their transfer operation position to take the lift pins 12 out of the respective through holes 79 and the horizontal movement mechanism 13 moves the pair of transfer arms 11 so as to open the transfer arms 11, the transfer arms 11 move to their retracted position. An exhaust mechanism (not illustrated) is also provided near a portion where the drive unit (the horizontal movement mechanism 13 and the lifting mechanism 14) of the transfer mechanism 10 are provided, and is configured to exhaust an atmosphere around the drive unit of the transfer mechanism 10 to the outside of the chamber 6.

Referring again to FIG. 1, the flash heating unit 5 provided over the chamber 6 includes a housing 51, a light source provided inside the housing 51, being composed of the multiple (in the present preferred embodiment, 30) xenon flash lamps FL, and a reflector 52 provided inside the housing 51 so as to cover the light source from above. The flash heating unit 5 further includes a lamp light radiation window 53 mounted to the bottom of the housing 51. The lamp light radiation window 53 forming the floor of the flash heating unit 5 is a plate-like quartz window made of quartz. The flash heating unit 5 is provided over the chamber 6, whereby the lamp light radiation window 53 is opposed to the upper chamber window 63. The flash lamps FL each irradiate the heat treatment space 65 with a flash of light from over the chamber 6 through the lamp light radiation window 53 and the upper chamber window 63.

The flash lamps FL, each of which is a rod-shaped lamp having an elongated cylindrical shape, are arranged in a plane such that the flash lamps FL are parallel to each other in their longitudinal directions, along a main surface of a semiconductor wafer W held by the holder 7 (or along a horizontal direction). Thus, a plane defined by the arrangement of the flash lamps FL is also a horizontal plane.

The xenon flash lamp FL includes a rod-shaped glass tube (discharge tube) containing xenon gas sealed therein and having positive and negative electrodes provided on opposite ends thereof, the electrodes being connected to a capacitor, and a trigger electrode attached to the outer peripheral surface of the glass tube. A xenon gas is electrically insulated, so that no electricity flows in the glass tube in a normal state even if electric charges are accumulated in the capacitor. However, when high voltage is applied to the trigger electrode to produce an electrical breakdown, electricity accumulated in the capacitor flows momentarily in the glass tube, and then xenon atoms or molecules are excited to cause light emission. In the xenon flash lamp FL as described above, electrostatic energy preliminarily accumulated in the capacitor is converted into an extremely short optical pulse of 0.1 milliseconds to 100 milliseconds, so that it has a feature capable of emitting extremely intensive light as compared with a light source of continuous lighting like the halogen lamp HL. In other words, the flash lamp FL is a pulse light emission lamp that emits light in an extremely short time of less than one second. The flash lamp FL has a light emission time that can be adjusted by changing a coil constant of a lamp power source that supplies electric power to the flash lamp FL.

The reflector 52 is provided over the plurality of flash lamps FL so as to cover all of the flash lamps FL. The reflector 52 has a fundamental function of reflecting flashes of light emitted from the plurality of flash lamps FL toward the heat treatment space 65. The reflector 52 is a plate made of an aluminum alloy, and has a surface (a surface facing the flash lamps FL) that is roughened by abrasive blasting.

The halogen heating unit 4 provided under the chamber 6 includes a housing 41 incorporating the multiple (in the present preferred embodiment, 40) halogen lamps HL. The halogen heating unit 4 is a light irradiator that irradiates the heat treatment space 65 with light from under the chamber 6 through the lower chamber window 64 to heat the semiconductor wafer W by the halogen lamps HL.

FIG. 7 is a plan view illustrating a placement of the multiple halogen lamps HL. The 40 halogen lamps HL are disposed in two tiers, i.e. upper and lower tiers. That is, 20 halogen lamps HL are disposed in the upper tier closer to the holder 7, and 20 halogen lamps HL are disposed in the lower tier farther from the holder 7 than the upper tier. Each of the halogen lamps HL is a rod-shaped lamp having an elongated cylindrical shape. The 20 halogen lamps HL in the upper tier and the 20 halogen lamps HL in the lower tier are arranged so as to be parallel to each other in their longitudinal directions along a main surface of a semiconductor wafer W held by the holder 7 (or along a horizontal direction). Thus, a plane defined by the arrangement of the halogen lamps HL in each of the upper and lower tiers is also a horizontal plane.

As illustrated in FIG. 7, the halogen lamps HL in each of the upper and lower tiers are disposed at a higher density in a region opposed to the peripheral portion of the semiconductor wafer W held by the holder 7 than in a region opposed to the central portion thereof. In other words, the halogen lamps HL in each of the upper and lower tiers are arranged at shorter intervals in the peripheral portion of the lamp arrangement than in the central portion thereof. This allows a greater amount of light to impinge upon the peripheral portion of the semiconductor wafer W where a temperature decrease is prone to occur when the semiconductor wafer W is heated by the irradiation thereof with light from the halogen heating unit 4.

The group of halogen lamps HL in the upper tier and the group of halogen lamps HL in the lower tier are arranged to intersect each other in a lattice pattern. In other words, the 40 halogen lamps HL in total are disposed such that the 20 halogen lamps HL arranged in the upper tier and the 20 halogen lamps HL arranged in the lower tier are orthogonal to each other in their longitudinal directions.

Each of the halogen lamps HL is a filament-type light source that passes current through a filament disposed in a glass tube to make the filament incandescent, thereby emitting light. A gas prepared by injecting a halogen element (iodine, bromine, and the like) in trace amounts into an inert gas such as nitrogen, argon, and the like is sealed in the glass tube. The injection of the halogen element allows the temperature of the filament to be set at a high temperature while suppressing a break in the filament. Thus, the halogen lamps HL have the properties of having a longer life than typical incandescent lamps and being capable of continuously emitting intense light. That is, the halogen lamps HL are continuous lighting lamps that emit light continuously for not less than one second. In addition, the halogen lamps HL, which are rod-shaped lamps, have a long life. The arrangement of the halogen lamps HL in a horizontal direction provides good efficiency of radiation toward the semiconductor wafer W provided over the halogen lamps HL.

A reflector 43 is provided also inside the housing 41 of the halogen heating unit 4 under the halogen lamps HL arranged in two tiers (refer to FIG. 1). The reflector 43 reflects light emitted from the halogen lamps HL toward the heat treatment space 65.

The controller 3 controls the aforementioned various operating mechanisms provided in the heat treatment apparatus 1. The controller 3 is similar in hardware configuration to a typical computer. Specifically, the controller 3 includes a CPU that is a circuit for performing various computation processes, a ROM or read-only memory for storing a basic program therein, a RAM or readable/writable memory for storing various pieces of information therein, and a magnetic disk for storing control software, data, and the like therein. The CPU in the controller 3 executes a predetermined processing program, whereby processing in the heat treatment apparatus 1 proceeds.

The heat treatment apparatus 1 further includes, in addition to the aforementioned components, various cooling structures to prevent an excessive temperature rise in the halogen heating unit 4, the flash heating unit 5, and the chamber 6 because of the heat energy generated from the halogen lamps HL and the flash lamps FL during the heat treatment of a semiconductor wafer W. As an example, a water cooling tube (not illustrated) is provided in the walls of the chamber 6. In addition, the halogen heating unit 4 and the flash heating unit 5 have an air cooling structure for forming a gas flow therein to exhaust heat. Air is supplied to a gap between the upper chamber window 63 and the lamp light radiation window 53 to cool down the flash heating unit 5 and the upper chamber window 63.

Subsequently, a treatment procedure for a semiconductor wafer W in the heat treatment apparatus 1 will be described. The semiconductor wafer W to be treated is a semiconductor substrate into which impurities (ions) are added by an ion implantation method. The impurities are activated by heating treatment (annealing) by flash irradiation, performed by the heat treatment apparatus 1. A procedure for the treatment in the heat treatment apparatus 1 to be described below proceeds under the control of the controller 3 over the operating mechanisms of the heat treatment apparatus 1.

First, the valve 84 for the treatment gas supply is opened and the valves 89 and 192 for exhaust are opened to start ventilation in the chamber 6. When the valve 84 is opened, nitrogen gas is supplied into the heat treatment space 65 through the gas supply opening 81. In addition, when the valve 89 is opened, gas in the chamber 6 is exhausted through the gas exhaust opening 86. This causes the nitrogen gas supplied from an upper portion of the heat treatment space 65 of the chamber 6 to flow downward to be discharged from a lower portion of the heat treatment space 65.

When the valve 192 is opened, gas in the chamber 6 is also exhausted through the transport opening 66. In addition, the exhaust mechanism (not illustrated) exhausts an atmosphere near the drive unit of the transport mechanism 10. When heat treatment is applied to the semiconductor wafer W in the heat treatment apparatus 1, nitrogen gas is continuously supplied into the heat treatment space 65. The amount of the supply is appropriately changed depending on a treatment step.

Subsequently, the gate valve 185 is opened to open the transport opening 66. A transfer robot outside the heat treatment apparatus 1 transfers a semiconductor wafer W to be treated into the heat treatment space 65 of the chamber 6 through the transport opening 66. While at this time, an atmosphere outside the apparatus may be sucked when the semiconductor wafer W is transported, nitrogen gas being continuously supplied into the chamber 6 flows out through the transportation opening 66 to enable reduction in suction of an external atmosphere as much as possible.

The semiconductor wafer W transported into the heat treatment space 65 by the transport robot is moved forward to a position lying immediately over the holder 7 and is stopped thereat. Then, the pair of transfer arms 11 of the transfer mechanism 10 is moved horizontally from the retracted position to the transfer operation position and is then moved upward, whereby the lift pins 12 pass through the through holes 79 and protrude from the upper surface of the holding plate 75 of the susceptor 74 to receive the semiconductor wafer W. At this time, the lift pins 12 move upward to above the upper ends of the substrate support pins 77.

After the semiconductor wafer W is placed on the lift pins 12, the transport robot moves out of the heat treatment space 65, and the gate valve 185 closes the transport opening 66. Then, the pair of transfer arms 11 moves downward to transfer the semiconductor wafer W from the transfer mechanism 10 to the susceptor 74 of the holder 7, so that the semiconductor wafer W is held from below in a horizontal posture. The semiconductor wafer W is supported by the substrate support pins 77 provided upright on the holding plate 75, and is held by the susceptor 74. The semiconductor wafer W is held by the holder 7 such that its front surface into which impurities are implanted by pattern formation faces upward. A predetermined distance is defined between the back surface (a main surface opposite to the front surface) of the semiconductor wafer W supported by the substrate support pins 77 and the upper surface of the holding plate 75. The pair of transfer arms 11 moved downward below the susceptor 74 is moved back to the retracted position by the horizontal movement mechanism 13.

When a semiconductor wafer W is transferred into the chamber 6, the light absorption ring 20 is disposed around the susceptor 74. The light absorption ring 20 is vertically moved to a position by the lifting drive unit 25 such that its upper surface is lower than an upper end of the substrate support pin 77. Thus, when the semiconductor wafer W is held by the susceptor 74, a peripheral portion of the lower surface of the semiconductor wafer W and the light absorption ring 20 closely face each other (refer to FIGS. 3 and 4). After the semiconductor wafer W is held by the susceptor 74, a height of the light absorption ring 20 is adjusted by the lifting drive unit 25 so that the distance d between the peripheral portion of the lower surface of the semiconductor wafer W and the light absorption ring 20 becomes a predetermined value.

The semiconductor wafer W is held from below by the susceptor 74 of the holder 7 in a horizontal posture, and then the 40 halogen lamps HL of the halogen heating unit 4 light up all together to start preliminary heating (assist heating). Halogen light emitted from the halogen lamps HL is transmitted through the lower chamber window 64 and the susceptor 74 both made of quartz, and impinges upon the lower surface of the semiconductor wafer W. When light irradiation from the halogen lamps HL is received, the semiconductor wafer W is preliminarily heated to be increased in temperature.

The radiation thermometer 120 measures temperature of the semiconductor wafer W when the halogen lamps HL perform the preliminary heating. Specifically, the radiation thermometer 120 receives infrared radiation emitted from the lower surface of the semiconductor wafer W held by the susceptor 74 through the opening 78 to measure temperature of the semiconductor wafer W increasing in temperature. The measured temperature of the semiconductor wafer W is transmitted to the controller 3. The controller 3 controls the output from the halogen lamps HL while monitoring whether or not the temperature of the semiconductor wafer W increasing in temperature by emission of light from the halogen lamps HL reaches a predetermined preliminary heating temperature T1. In other words, the controller 3 effects feedback control of the output from the halogen lamps HL so that the temperature of the semiconductor wafer W is equal to the preliminary heating temperature T1 on the basis of the value measured with the radiation thermometer 120. The preliminary heating temperature T1 is set to a temperature within a range from 200° C. to 800° C., preferably from 350° C. to 600° C. (600° C. in the present preferred embodiment).

After the temperature of the semiconductor wafer W reaches the preliminary heating temperature T1, the controller 3 maintains the temperature of the semiconductor wafer W at the preliminary heating temperature T1 for a while. Specifically, when the temperature of the semiconductor wafer W measured with the radiation thermometer 120 reaches the preliminary heating temperature T1, the controller 3 controls the output from the halogen lamps HL to maintain the temperature of the semiconductor wafer W at approximately the preliminary heating temperature T1.

In the stage of the preliminary heating using the halogen lamps HL, the semiconductor wafer W shows a tendency to be lower in temperature in a peripheral portion thereof where heat dissipation is liable to occur than in a central portion thereof. In the preferred embodiment, the light absorption ring 20 is provided so as to be close to a peripheral portion of a semiconductor wafer W held by the susceptor 74. The light absorption ring 20 absorbs infrared light and transmits visible light through itself.

In spectral distribution of light emitted from the halogen lamps HL, intensity in an infrared part is mainly high. That is, the halogen lamp HL mainly emits infrared light. Thus, light emitted from the halogen lamp HL is also absorbed by the light absorption ring 20. Then, temperature of the light absorption ring 20 also increases by absorbing light emitted from the halogen lamps HL. When the light absorption ring 20 closely facing the peripheral portion of the lower surface of the semiconductor wafer W is increased in temperature, the peripheral portion of the semiconductor wafer W is heated by heat radiation from the light absorption ring 20. As a result, while heat is radiated from a peripheral portion of the semiconductor wafer W during preliminary heating, heat from the light absorption ring 20 is applied to the peripheral portion of the semiconductor wafer W. In other words, heat discharged from a peripheral portion of a semiconductor wafer W, preliminary heated by the halogen lamps HL, is compensated by the light absorption ring 20, so that in-plane temperature distribution of a semiconductor wafer W during preliminary heating can be uniform.

At the time when a predetermined time elapses after temperature of a semiconductor wafer W reaches a preliminary heating temperature T1, the flash lamps FL of the flash heating unit 5 irradiates a front surface of the semiconductor wafer W with a flash of light. At this time, a part of a flash of light emitted from each of the flash lamps FL directly radiates into the chamber 6, and the other thereof radiates into the chamber 6 after being reflected once by the reflector 52, and then flash heating of the semiconductor wafer W is performed by emission of these flashes of light.

The flash heating is performed by flash irradiation from each of the flash lamps FL, so that front surface temperature of the semiconductor wafer W can be increased in a short time. In other words, a flash of light emitted from each of the flash lamps FL is an extremely-short and intensive flash acquired by converting electrostatic energy preliminarily accumulated in a capacitor into an extremely short optical pulse of the order of emission time of not less than 0.1 milliseconds and not more than 100 milliseconds. Then, front surface temperature of the semiconductor wafer W irradiated with a flash of light from each of the flash lamps FL for flash heating momentarily increases to a treatment temperature T2 of 1000° C. or more, and rapidly decreases after impurities implanted into the semiconductor wafer W are activated. As described above, the heat treatment apparatus 1 can increase and decrease front surface temperature of the semiconductor wafer W in an extremely short time, so that impurities implanted into the semiconductor wafer W can be activated while thermal diffusion of the impurities is suppressed. A time required for activation of the impurities is extremely short as compared with a time required for thermal diffusion thereof, so that the activation is completed even in a short time of the order of from 0.1 milliseconds to 100 milliseconds, where no diffusion occurs.

In the present preferred embodiment, the light absorption ring 20 is provided so as to be close to a peripheral portion of a semiconductor wafer W held by the susceptor 74 and heat radiated from the peripheral portion of the semiconductor wafer W during preliminary heating is compensated by the light absorption ring 20, so that uniform in-plane temperature distribution of the semiconductor wafer W in a preliminary heating stage is achieved. As a result, in-plane temperature distribution in a front surface of a semiconductor wafer W during irradiation of a flash of light also can be uniform.

The light absorption ring 20 absorbs infrared light and transmits visible light through itself. In spectral distribution of flash of light emitted from the flash lamps FL, intensity in a visible light part is mainly high, and the light has a wavelength shorter than that of light emitted from the halogen lamps HL. That is, the flash lamp FL mainly emits visible light. Thus, light emitted from the flash lamp FL is not absorbed by the light absorption ring 20, and transmitted through the light absorption ring 20. This prevents the light absorption ring 20 from being thermally damaged by irradiation of a flash of light from the flash lamp FL. Irradiation time of a flash of light during flash heating is extremely short, so that even a flash of light transmitted through the light absorption ring 20 does not affect temperature distribution of a semiconductor wafer W.

After flash heating treatment is finished, the halogen lamps HL each are tuned off after elapse of a predetermined time. This causes the semiconductor wafer W to rapidly decrease in temperature from the preliminary heating temperature T1. The radiation thermometer 120 measures the temperature of the semiconductor wafer W decreasing in temperature, and a result of measurement is transmitted to the controller 3. The controller 3 monitors whether the temperature of the semiconductor wafer W is decreased to a predetermined temperature on the basis of the result of measurement with the radiation thermometer 120. After the temperature of the semiconductor wafer W is decreased to the predetermined temperature or below, the pair of transfer arms 11 of the transfer mechanism 10 is moved horizontally again from the retracted position to the transfer operation position and is then moved upward, so that the lift pins 12 protrude from the upper surface of the susceptor 74 to receive the heat-treated semiconductor wafer W from the susceptor 74. Subsequently, the transport opening 66 which has been closed is opened by the gate valve 185, and the transfer robot outside the heat treatment apparatus 1 transfers the semiconductor wafer W placed on the lift pins 12 to the outside. Thus, the heat treatment apparatus 1 completes the heating treatment of the semiconductor wafer W.

In the preferred embodiment, the light absorption ring 20 is provided so as to be close to a peripheral portion of a semiconductor wafer W held by the susceptor 74. The light absorption ring 20 absorbs infrared light and transmits visible light through itself. The halogen lamp HL performing preliminary heating mainly emits infrared light, and the flash lamp FL performing flash heating mainly emits visible light. In general terms, the light absorption ring 20 absorbs light emitted from the halogen lamps HL, and transmits a flash of light emitted from the flash lamps FL through itself.

Thus, during preliminary heating by the halogen lamps HL, the light absorption ring 20 absorbs light emitted from the halogen lamps HL to be increased in temperature so that heat radiated from a peripheral portion of a semiconductor wafer W is compensated to cause in-plane temperature distribution of the semiconductor wafer W to be uniform. Meanwhile, during irradiation of a flash of light by the flash lamps FL, a flash of light emitted from the flash lamps FL is transmitted through the light absorption ring 20, so that the light absorption ring 20 is prevented from being thermally damaged. That is, when the light absorption ring 20 absorbing infrared light and transmitting visible light through itself is provided so as to be close to a peripheral portion of a semiconductor wafer W held by the susceptor 74, in-plane temperature distribution of the semiconductor wafer W can be uniform without causing damage by irradiation of a flash of light.

In the present preferred embodiment, the susceptor 74 having a plane size smaller than that of a semiconductor wafer W holds a semiconductor wafer W. Thus, there is not the susceptor 74 made of quartz near a peripheral portion of the semiconductor wafer W. The susceptor 74 made of quartz also transmits infrared light emitted from the halogen lamps HL through itself, and thus is hardly increased in temperature during preliminary heating to cause heat dissipation from a peripheral portion of a semiconductor wafer W. In the present preferred embodiment, there is not the susceptor 74 made of quartz near a peripheral portion of a semiconductor wafer W, so that in-plane temperature distribution of the semiconductor wafer W can be more uniform by reducing heat dissipation from the peripheral portion of the semiconductor wafer W during preliminary heating.

While the preferred embodiments according to the present invention are described above, various modifications of the present invention in addition to those described above may be made without departing from the scope and spirit of the invention. For example, while the light absorption ring 20 is disposed so as to face a peripheral portion of a lower surface of a semiconductor wafer W held by the susceptor 74 in the above preferred embodiment, the present invention is not limited to this. The light absorption ring 20 may be disposed so as to surround an end edge portion of a semiconductor wafer W, or the light absorption ring 20 may be disposed so as to face a peripheral portion of an upper surface of a semiconductor wafer W. Even placement as described above enables heat radiated from a peripheral portion of a semiconductor wafer W during preliminary heating to be compensated by the light absorption ring 20, so that in-plane temperature distribution of the semiconductor wafer W can be uniform. That is, the light absorption ring 20 may be provided so as to be close to a peripheral portion of a semiconductor wafer W held by the susceptor 74. When the light absorption ring 20 is disposed so as to face a peripheral portion of an upper surface of a semiconductor wafer W, the light absorption ring 20 may be an obstruction during irradiation of a flash of light. Thus, it is preferable that the light absorption ring 20 be provided so as to face a peripheral portion of a lower surface of a semiconductor wafer W like the above preferred embodiment.

When material of the light absorption ring 20 contains an unfavorable component for a semiconductor manufacturing process, the light absorption ring 20 may be covered with quartz. FIG. 9 illustrates an example of the light absorption ring 20 covered with quartz. The light absorption ring 20 is made of a material similar to that of the above preferred embodiment, and absorbs infrared light and transmits visible light through itself. The entire surface of the light absorption ring 20 is covered with a quartz covering member 29. This enables an unfavorable component for a semiconductor manufacturing process, contained in the light absorption ring 20, to be prevented from adhering to a semiconductor wafer W.

In addition to the radiation thermometer 120, a plurality of radiation thermometers for measuring temperature at different positions of a semiconductor wafer W may be provided. The plurality of radiation thermometers measures temperature at a central portion, a peripheral portion, and an intermediate portion therebetween of a semiconductor wafer W, for example. The distance d between a peripheral portion of a lower surface of a semiconductor wafer W and the light absorption ring 20 may be adjusted in accordance with a level of temperature decrease in a peripheral portion of the semiconductor wafer W. When a level of temperature decrease in a peripheral portion of a semiconductor wafer W is large, the light absorption ring 20 is raised to reduce the distance d, and when a level of temperature decrease in the peripheral portion is small, the light absorption ring 20 is lowered to increase the distance d. More specifically, the controller 3 applies feedback control to the lifting drive unit 25 to adjust the distance d such that temperature in a peripheral portion of a semiconductor wafer W becomes equal to temperature in a central portion thereof.

While the 30 flash lamps FL are provided in the flash heating unit 5 in the above preferred embodiment, the present invention is not limited to this, and any number of flash lamps FL may be provided. The flash lamps FL are not limited to the xenon flash lamps, and may be krypton flash lamps. The number of halogen lamps HL provided in the halogen heating part 4 is also not limited to 40, and any number of halogen lamps HL may be provided.

In the above preferred embodiment, while the filament-type halogen lamps HL each are used as a continuous lighting lamp that emits light continuously for not less than one second to preliminarily heat the semiconductor wafer W, but not limited to this, an arc lamp of a discharge type may be used as a continuous lighting lamp in place of the halogen lamp HL to perform preliminary heating.

A substrate to be treated by the heat treatment apparatus according to the present invention is not limited to a semiconductor wafer, and may be a glass substrate to be used for a flat panel display such as a liquid crystal display device, and a substrate for a solar cell. When a substrate to be treated is a rectangular glass substrate, the light absorption ring 20 is to be in the shape of a quadrangular ring. The art according to the present invention may be applicable for heat treatment for a high-permittivity gate insulating film (High-k film), joining between metal and silicon, and crystallization of polysilicon.

While the invention has been shown and described in detail, the foregoing description is in all aspects illustrative and not restrictive. It is therefore understood that numerous modifications and variations can be devised without departing from the scope of the invention.

What is claimed is:

1. A heat treatment apparatus that irradiates a substrate with a flash of light to heat the substrate, the heat treatment apparatus comprising:
   a chamber that accommodates a substrate;
   a quartz susceptor that holds said substrate in said chamber;
   a continuous lighting lamp that is provided under said chamber to irradiate a lower surface of said substrate held by said quartz susceptor with light;
   a flash lamp that is provided over said chamber to irradiate an upper surface of said substrate held by said quartz susceptor with a flash of light; and
   an infrared-light absorption component that is provided so as to be close to a peripheral portion of said substrate held by said quartz susceptor, and has an infrared light transmittance of 20% or less, and a visible light transmittance of 60% or more.

2. The heat treatment apparatus according to claim 1, further comprising:
   a drive assembly that moves up and down said infrared-light absorption component in said chamber.

3. The heat treatment apparatus according to claim 1, wherein said infrared-light absorption component is covered with a quartz covering member.

4. The heat treatment apparatus according to claim 1, wherein said quartz susceptor has a plane size smaller than a plane size of said substrate.

* * * * *